(12) United States Patent
Kojima et al.

(10) Patent No.: US 9,091,931 B2
(45) Date of Patent: Jul. 28, 2015

(54) PHOTOMASK BLANK AND METHOD FOR MANUFACTURING PHOTOMASK

(75) Inventors: Yosuke Kojima, Tokyo (JP); Hiroki Yoshikawa, Joetsu (JP); Yukio Inazuki, Joetsu (JP); Ryuji Koitabashi, Joetsu (JP)

(73) Assignees: TOPPAN PRINTING CO., LTD., Tokyo (JP); SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 13/494,530

(22) Filed: Jun. 12, 2012

(65) Prior Publication Data

US 2012/0251930 A1     Oct. 4, 2012

Related U.S. Application Data

(63) Continuation of application No. PCT/JP2010/071720, filed on Dec. 3, 2010.

(30) Foreign Application Priority Data

Dec. 14, 2009    (JP) ................................ 2009-283198

(51) Int. Cl.
    *G03F 1/50*       (2012.01)
    *G03F 1/30*       (2012.01)
    *G03F 1/32*       (2012.01)

(52) U.S. Cl.
    CPC ... *G03F 1/30* (2013.01); *G03F 1/32* (2013.01)

(58) Field of Classification Search
    CPC ........................................................ G03F 1/50

USPC ......................................................... 430/4–5
See application file for complete search history.

(56) References Cited

U.S. PATENT DOCUMENTS

| | | | |
|---|---|---|---|
| 2005/0208389 A1* | 9/2005 | Ishibashi et al. | ................... 430/5 |
| 2006/0088774 A1 | 4/2006 | Yoshikawa et al. | |
| 2007/0190459 A1 | 8/2007 | Hashimoto et al. | |
| 2008/0070132 A1 | 3/2008 | Hashimoto et al. | |
| 2009/0047584 A1 | 2/2009 | Hashimoto et al. | |
| 2009/0253054 A1 | 10/2009 | Kominato et al. | |
| 2010/0273098 A1 | 10/2010 | Ogawa et al. | |

FOREIGN PATENT DOCUMENTS

| | | |
|---|---|---|
| CN | 1763632 | 4/2006 |
| CN | 101010631 A | 8/2007 |

(Continued)

OTHER PUBLICATIONS

Chinese Office Action mailed Jul. 10, 2013 in corresponding Chinese Application No. 201080056696.X.

(Continued)

*Primary Examiner* — Stephen Rosasco

(57) ABSTRACT

According to one embodiment, a photomask blank wherein a second film is stacked on a first film, the first film containing chromium and which is not substantially etched by the dry etching using fluorine and which is etchable by the dry etching using oxygen-containing chlorine, and the second film containing no chromium and which is etchable by dry etching using fluorine and dry etching using oxygen-containing chlorine.

6 Claims, 4 Drawing Sheets

(56) References Cited

FOREIGN PATENT DOCUMENTS

| CN | 101517483 A | 8/2009 |
|---|---|---|
| JP | 4-226461 | 8/1992 |
| JP | 2003-107675 | 4/2003 |
| JP | 2006-146151 | 6/2006 |
| JP | 2007-114451 | 5/2007 |
| JP | 2007-241259 | 9/2007 |
| JP | 2008-268980 | 11/2008 |
| JP | 2009-265620 | 11/2009 |
| WO | WO 2007/046454 | 4/2007 |
| WO | WO 2007/072778 | 6/2007 |
| WO | WO 2007/072778 A1 | 6/2007 |
| WO | WO 2009/084516 | 7/2009 |

OTHER PUBLICATIONS

Extended European Search Report dated Jun. 26, 2014 in corresponding European Patent Application No. 10837459.6.
Japanese Office Action mailed May 20, 2014 in corresponding Japanese Patent Application No. 2009-283198.
International Preliminary Report on Patentability mailed Jul. 19, 2012 for corresponding International Application No. PCT/JP2010/071720.
Chinese Office Action dated Oct. 21, 2014 in corresponding Chinese Patent Application No. 201080056696.X.
International Search Report of PCT/JP2010/071720 mailed Feb. 22, 2011.

* cited by examiner

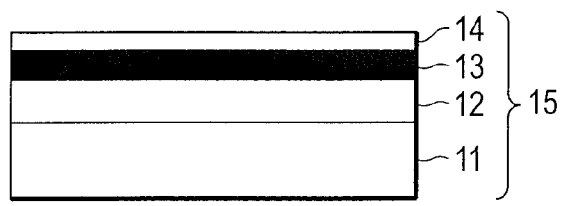
F I G. 1
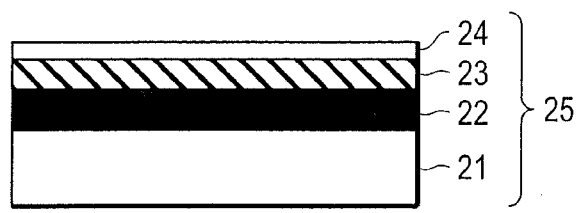
F I G. 2
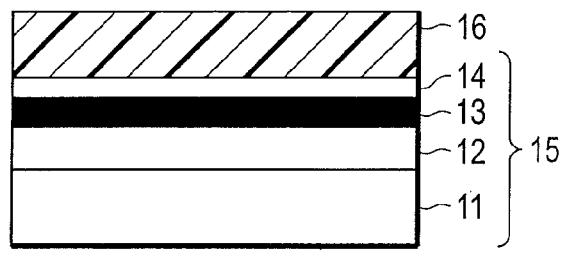
F I G. 3
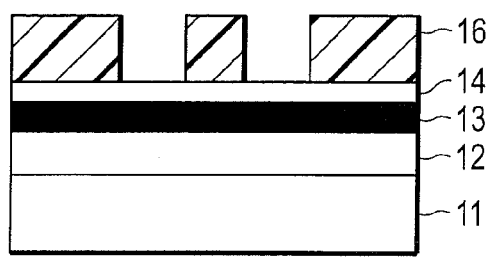
F I G. 4

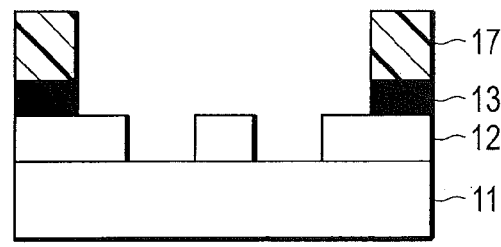
F I G. 9
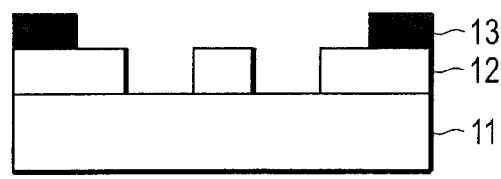
F I G. 10
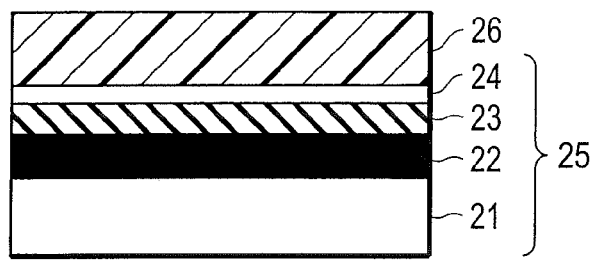
F I G. 11
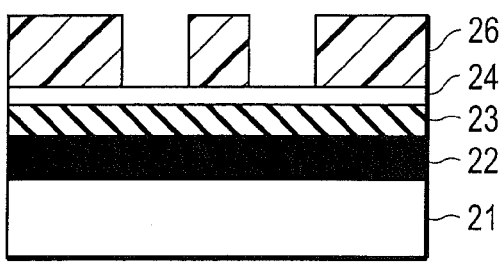
F I G. 12

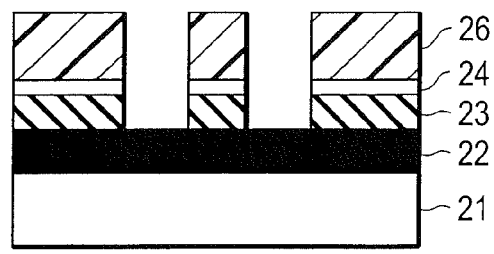
F I G. 13
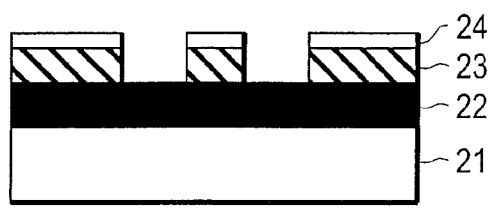
F I G. 14
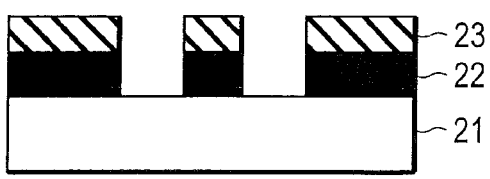
F I G. 15
F I G. 16

PHOTOMASK BLANK AND METHOD FOR MANUFACTURING PHOTOMASK

CROSS REFERENCE TO RELATED APPLICATIONS

This application is a Continuation Application of PCT Application No. PCT/JP2010/071720, filed Dec. 3, 2010 and based upon and claiming the benefit of priority from prior Japanese Patent Application No. 2009-283198, filed Dec. 14, 2009, the entire contents of all of which are incorporated herein by reference.

BACKGROUND OF THE INVENTION

1. Field of the Invention

The present invention relates to a photomask blank for use in manufacturing a semiconductor integrated circuit or the like including an accurate fine pattern, and a method for manufacturing the photomask.

2. Description of the Related Art

In recent years, with increasing integration of semiconductor devices such as large-scale integrated circuits (LSI), circuit patterns have been increasingly miniaturized. For implementation of such fine circuit patterns, there has been a demand to thin interconnect patterns and contact hole patterns which form circuits. These fine circuit patterns are commonly carried out by photolithography using a photomask, thus leading to a demand to finely and accurately form the pattern of the photomask, which serves as a master.

A common method for manufacturing a photomask pattern is as follows. A resist film is formed on a photomask blank with a light blocking film formed on a transparent substrate such as a glass substrate. Thereafter, a pattern is drawn on the resist film by light or an electron beam. The resist film with the pattern drawn thereon is developed to form a resist pattern. The resist pattern is used as an etching mask to etch the light blocking film. Thus, a pattern (photomask pattern) including a light blocking portion and a light transmission portion is formed. With the increasingly miniaturized photomask pattern, the drawing is mostly based on electron beam exposure. Furthermore, the etching is mostly based on dry etching using gas plasma.

For an electron beam lithography apparatus for use in drawing patterns, every effort has been made to increase acceleration voltage in order to achieve high resolution in response to a demand for pattern miniaturization. However, a higher acceleration voltage for an electron beam increases the amount of electrons passing through the resist film when the resist is subjected to the drawing. Hence, disadvantageously, the resist may become less sensitive.

Thus, the resist for use in manufacturing a photomask is mostly of a chemical amplification type that is very sensitive. A typical chemical amplification resist uses what is called a photoacid generator that generates an acid by means of light or an electron beam. A negative resist is a resist a portion of which is subjected to a crosslinking reaction with an acid generated by irradiation with light or an electron beam and thus becomes less soluble to a solvent (developer). A positive resist is a resist that is made more soluble by an acid generated by irradiation with light or an electron beam to remove a protective group from a resin. The acid generated acts as a catalyst to cause a chain reaction by, for example, starting or promoting the next reaction. Thus, such a chemical amplification resist has the advantage of achieving a high resolution in spite of being sensitive (see, for example, Patent Document 1).

The light blocking film for the photomask blank is mostly formed of a chromium compound. A light blocking film formed of such a chromium compound is stacked on a transparent substrate or a phase-shift film formed of a silicon compound. Furthermore, a photomask blank has been proposed in which a silicon compound is used as a light blocking film and in which a hard mask or a antireflective film formed of a chromium compound or a chromium metal film is stacked on the light blocking film (see, for example, Patent Document 2).

However, in the photomask blank in which a chemical amplification resist is provided directly on the film containing chromium, the cross-sectional shape of the chemical amplification resist may be degraded at the interface between the film containing chromium and the chemical amplification film. Specifically, the chemical amplification resist is shaped like a hemming bottom when the resist is of a positive type and is shaped like a dug-in when the resist is of a negative type. This is because the acid is coordinated to a lone pair (unshared electron pair) in the chromium compound to deactivate a portion of the acid in the resist which is located near the interface.

If the cross-sectional shape of the resist is thus degraded, a deviation from a desired size occurs when the film containing chromium is etched using the resist pattern as an etching mask. Specifically, with the positive resist, the hemming bottom shape prevents micro spaces or holes from being properly formed. Furthermore, with the negative resist, the dug-in shape causes the resist pattern to be collapsed during development or cleaning.

As means for solving these problems, a method for stacking a film formed of a silicon compound containing no chromium, on a film containing chromium (see, for example, Patent Document 3). However, the film containing chromium is not substantially etched by dry etching using fluorine (F) but by dry etching using oxygen-containing chlorine (Cl/O). In contrast, the film formed of a silicon compound containing no chromium is not substantially etched by the dry etching using oxygen-containing chlorine (Cl/O) but by the dry etching using fluorine (F). This increases the numbers of steps and conditions for the dry etching and thus a cycle time for production of a photomask. Furthermore, this method is disadvantageous for rate control for an etching apparatus and defect management. Additionally, the dry etching using oxygen-containing chlorine (Cl/O) is less directional and results in isotropic etching. Hence, the size of a film containing chromium which has been patterned by the dry etching using oxygen-containing chlorine deviate from that of the film formed of a silicon compound containing no chromium and which has been patterned by the dry etching using fluorine (F), which is anisotropic. This causes an error in the size of the final photomask pattern. Furthermore, if the two films with the different sizes are used as an etching mask to further etch an underlying film, the cross-sectional shape of the underlying film may disadvantageously be degraded.

PRIOR ART DOCUMENTS

Patent Documents

Patent Document 1: Jpn. Pat. Appln. KOKAI Publication No. 4-226461
Patent Document 2: Jpn. Pat. Appln. KOKAI Publication No. 2008-268980

Patent Document 3: Jpn. Pat. Appln. KOKAI Publication No. 2006-146151

BRIEF SUMMARY OF THE INVENTION

Problem to be Solved by the Invention

An object of the present invention is to provide a photomask blank that enables a pattern to be properly formed.

Means for Solving the Problem

According to an aspect of the present invention, there is provided a photomask blank wherein a second film is stacked on a first film, the first film containing chromium and which is not substantially etched by the dry etching using fluorine and which is etchable by the dry etching using oxygen-containing chlorine, and the second film containing no chromium and which is etchable by dry etching using fluorine and dry etching using oxygen-containing chlorine.

According to an aspect of the present invention, there is provided a method for manufacturing a photomask, comprising a photomask blank wherein a second film is stacked on a first film, the first film containing chromium and which is not substantially etched by the dry etching using fluorine and which is etchable by the dry etching using oxygen-containing chlorine, the second film containing no chromium and which is etchable by dry etching using fluorine and dry etching using oxygen-containing chlorine;

forming a resist with a pattern on the second film; and using the resist as a mask to etch the first film and the second film by the dry etching using oxygen-containing chlorine.

Advantage of the Invention

The present invention can provide a photomask blank that enables a pattern to be properly formed.

BRIEF DESCRIPTION OF THE SEVERAL VIEWS OF THE DRAWING

FIG. 1 is a cross-sectional view schematically showing a basic configuration of a photomask blank according to an embodiment of the present invention;

FIG. 2 is a cross-sectional view schematically showing the basic configuration of the photomask blank according to the embodiment of the present invention;

FIG. 3 is a cross-sectional view schematically showing a part of a method for manufacturing a photomask according to Example 1 of the present invention;

FIG. 4 is a cross-sectional view schematically showing a part of the method for manufacturing a photomask according to Example 1 of the present invention;

FIG. 9 is a cross-sectional view schematically showing a part of the method for manufacturing a photomask according to Example 1 of the present invention;

FIG. 10 is a cross-sectional view schematically showing a part of the method for manufacturing a photomask according to Example 1 of the present invention;

FIG. 11 is a cross-sectional view schematically showing a part of a method for manufacturing a photomask according to Example 2 of the present invention;

FIG. 12 is a cross-sectional view schematically showing a part of the method for manufacturing a photomask according to Example 2 of the present invention;

FIG. 13 is a cross-sectional view schematically showing a part of the method for manufacturing a photomask according to Example 2 of the present invention;

FIG. 14 is a cross-sectional view schematically showing a part of the method for manufacturing a photomask according to Example 2 of the present invention;

FIG. 15 is a cross-sectional view schematically showing a part of the method for manufacturing a photomask according to Example 2 of the present invention; and FIG. 16 is a cross-sectional view schematically showing a part of the method for manufacturing a photomask according to Example 2 of the present invention.

DETAILED DESCRIPTION OF THE INVENTION

Figure 5:
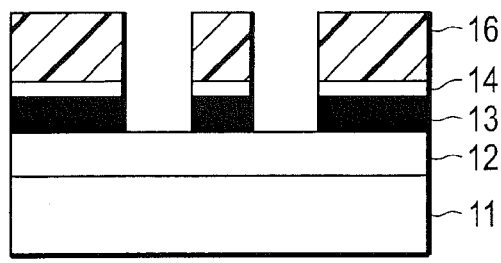
FIG. 5 is a cross-sectional view schematically showing a part of the method for manufacturing a photomask according to Example 1 of the present invention.

An embodiment of the present invention will be described below with reference to the drawings.

In the present embodiment, materials are optimally selected which have different compositions and which can be etched under the same dry etching conditions. A photomask blank will be described which enables formation of a fine pattern and accurate control of a pattern size, which are objects of photomask production corresponding to pattern transfer for the half pitch 45 nm generation and beyond.

As shown in FIG. 1, a photomask blank (phase-shift mask blank) 15 according to the embodiment of the present invention comprises a phase-shift film 12 located on a transparent substrate 11 and which is not substantially etched by dry etching using oxygen-containing chlorine (Cl/O) and which can be etched by dry etching using fluorine (F). The photomask blank comprises a light blocking film (first film) 13 located on the phase-shift film 12 and containing chromium and which is not substantially etched by the dry etching using fluorine (F) and which can be etched by the dry etching using oxygen-containing chlorine (Cl/O). The photomask blank comprises a film (second film) 14 located on the light blocking film 13 and containing no chromium and which can be etched by the dry etching using fluorine (F) and the dry etching using oxygen-containing chlorine (Cl/O).

That is, the film (second film) 14 containing no chromium and the light blocking film (first film) 13 containing chromium are dry etched by the dry etching using oxygen-containing chlorine (Cl/O). The film (second film) 14 containing no chromium and the phase-shift film 12 are etched by the dry etching using fluorine (F).

Here, fused silica, CaF2, or aluminum silicate glass can be used as the transparent substrate 11.

The phase-shift film 12 is formed of a silicon compound mainly comprising silicon oxide, silicon nitride, or silicon oxynitride and in which metal is contained. For the phase-shift film 12, the ratio of contents and film thickness are selected as needed to adjust transmittance and phase difference with respect to exposure wavelength. The value of the transmittance with respect to the exposure wavelength is at least 2% and at most 40% when production of a photomask is finally completed. Furthermore, the value of the phase difference with respect to the exposure wavelength is at least 170 degrees and at most 190 degrees when production of a photomask is finally completed. These values are selected as needed depending on a design pattern to be exposed and on conditions.

The light blocking film (first film) 13 containing chromium is a metal compound film mainly comprising chromium oxide, chromium nitride, or chromium oxynitride, or a metal film or an alloy film mainly comprising chromium. The light blocking film 13 may contain a nonmetal element such as carbon or fluorine. The film thickness of the light blocking film 13 is at least 30 nm and at most 120 nm and is preferably selected such that for the light blocking film 13 and the underlying phase-shift film 12, the transmittance with respect to the exposure wavelength is at most 0.1%.

The specific atomic composition of the light blocking film 13 containing chromium is such that for example, chromium (Cr)=30 to 85 at %, oxygen (O)=0 to 60 at %, nitrogen (N)=0 to 50 at %, and carbon (C)=0 to 20 at %.

Alternatively, the light blocking film 13 containing chromium may be an antireflective film formed by stacking a plurality of types of chromium with different compositions. In this case, reflectance with respect to the exposure wavelength is desirably limited to, for example, at most 20% and preferably at most 15% so as to suppress multipath reflection between the photomask and a projection surface during exposure. Moreover, the reflectance with respect to a wavelength (for example, 257 nm) for use in reflection inspection for a photomask blank or a photomask is desirably set to, for example, at most 30% so as to allow defects to be accurately detected.

The film 14 containing no chromium (second film) is at least 0.5 nm and at most 10 nm in film thickness. Furthermore, the film (second film) 14 containing no chromium desirably has a film thickness of at least 1 nm so as to be accurately stacked by a method such as reactive sputtering and with possible damage during development and cleaning of the photomask taken into account. Moreover, if the film thickness of the film 14 containing no chromium is reduced to at most 5 nm, when the dry etching using oxygen-containing chlorine (Cl/O) is carried out using a resist formed on the film 14 containing no chromium, etching of the film 14 containing no chromium can be completed quickly. This enables a reduction in damage to the resist.

Furthermore, the film 14 containing no chromium contains transition metal. Examples of the transition metal include molybdenum (Mo), tantalum (Ta), tungsten (W), zirconium (Zr), hafnium (Hf), vanadium (V), and niobium (Nb). Molybdenum is preferable in terms of the easiness of etching processing. Alternatively, the film 14 containing no chromium may be silicon oxide, silicon nitride, or silicon oxynitride which contains the transition metal.

The specific atomic configuration of the film 14 containing no chromium is such that for example, molybdenum (Mo) accounts for 10 to 100 at % of the sum of the molybdenum (Mo) and silicon (Si). Furthermore, in terms of easiness of etching processing for the dry etching using oxygen-containing chlorine (Cl/O), molybdenum (Mo) desirably accounts for 30 to 100 at % of the sum of the molybdenum (Mo) and silicon (Si).

As described above, the photomask blank 15 is configured to enable a photomask to be formed by selecting the composition and film thickness of the film 14 containing no chromium (second film) as needed and consecutively etching the film 14 containing no chromium (second film) and the light blocking film 13 containing chromium (first film) by means of the dry etching using oxygen-containing chlorine (Cl/O).

Conditions for the dry etching using oxygen-containing chlorine (Cl/O) may be well-known ones for use in dry etching a chromium compound film and are not particularly limited. Chlorine gas and oxygen gas as well as inert gas such as helium may be mixed.

Furthermore, conditions for the dry etching using fluorine (F) may be well-known ones for use in dry etching a silicon compound film and are not particularly limited. Fluorine gas is commonly CF4 or C2F6 and may be mixed with nitrogen gas or inert gas such as helium.

Furthermore, when a photomask is formed using the photomask blank 15, a resist is formed on The film (second film) 14 containing no chromium. As a material for the resist film, a chemical amplification resist for electron beam lithography is preferably used which enables an accurate pattern to be formed. The resist may be either positive or negative. The resist film is, for example, at least 50 nm and at most 350 nm in film thickness. In particular, if a photomask requiring formation of a fine pattern is to be produced, the resist film is at most 200 nm in film thickness because in order to prevent the pattern from being collapsed, the film thickness of the resist film needs to be reduced so as to preclude an increase in the high aspect ratio of the resist pattern. On the other hand, the lower limit of the film thickness of the resist film is determined with conditions such as the etching resistance of material of the resist film comprehensively considered. Thus, the film thickness of the resist film is at least 50 nm when the resist film is formed of a common material but is more preferably at least 75 nm.

As shown in FIG. 2, a photomask blank (binary mask blank) 25 according to the embodiment of the present invention comprises a light blocking film 22 located on a transparent substrate 21 and which is not substantially etched by the dry etching using oxygen-containing chlorine (Cl/O) and which can be etched by the dry etching using fluorine (F). The photomask blank 25 comprises a hard mask film (first film) 23 located on the light blocking film 22 and containing chromium and which is not substantially etched by the dry etching using fluorine (F) and which can be etched by the dry etching using oxygen-containing chlorine (Cl/O). The photomask blank 25 comprises a film (second film) 24 located on the hard mask film 23 and containing no chromium and which can be etched by the dry etching using fluorine (F) and the dry etching using oxygen-containing chlorine (Cl/O).

That is, the film (second film) 24 containing no chromium and the hard mask film (first film) 23 containing chromium are dry etched by the dry etching using oxygen-containing chlorine (Cl/O). The film (second film) 24 containing no chromium and the light blocking film 22 are etched by the dry etching using fluorine (F).

Here, the composition and film thickness of the transparent substrate 21 are similar to those of the above-described transparent substrate 11.

The light blocking film 22 is formed of a silicon compound mainly comprising silicon oxide, silicon nitride, or silicon oxynitride and in which metal is contained. For the light blocking film 22, the ratio of contents and the film thickness are selected as needed to adjust the transmittance with respect to exposure wavelength. The value of the transmittance with respect to the exposure wavelength is preferably selected to be at most 0.1% when production of a photomask is finally completed.

Alternatively, the light blocking film 22 may be an antireflective film formed by stacking a plurality of silicon compounds with different compositions. In this case, the reflectance with respect to the exposure wavelength is desirably limited to, for example, at most 20% and preferably at most 15% so as to suppress multipath reflection between the photomask and the projection surface during exposure. Moreover, the reflectance with respect to the wavelength (for example, 257 nm) for use in reflection inspection for a photomask blank or a photomask is desirably set to, for example, at most 30% so as to allow defects to be accurately detected.

The hard mask film (first film) 23 containing chromium is a metal compound film mainly comprising chromium oxide, chromium nitride, or chromium oxynitride, or a metal film or an alloy film mainly comprising chromium. The light blocking film 23 may contain a nonmetal element such as carbon or fluorine. The film thickness of the hard mask film 23 is at least 2 nm and at most 30 nm and is preferably set to at most 5 nm so as to reduce damage to the resist during etching.

The range of specific configuration of the hard mask film (first film) 23 containing chromium is similar to that of the above-described light blocking film 13 containing chromium.

The ranges of specific configuration and thickness of the film (second film) 24 containing no chromium is similar to those of the above-described film 14 containing no chromium.

As described above, the photomask blank 25 is configured to enable a photomask to be formed by selecting the composition and film thickness of the film (second film) 24 containing no chromium as needed and consecutively etching the film 24 containing no chromium and the hard mask film (first film) 23 containing chromium by means of dry etching using oxygen-containing chlorine (Cl/O).

Furthermore, when a photomask is formed using the photomask blank 25, a resist film is formed on the film (second film) 24 containing no chromium. The material and film thickness of the resist film are similar to those of a resist film formed on the above-described film (second film) 14 containing no chromium.

In the photomask blank according to the above-described embodiment, the second film containing no chromium and which can be etched by the dry etching using fluorine and the dry etching using oxygen-containing chlorine is stacked on the first film containing chromium and which is not substantially etched by the dry etching using fluorine and which can be etched by the dry etching using oxygen-containing chlorine.

If a chemical amplification rests is provided directly on the film containing chromium, the acid in a portion of the chemical amplification resist which is located near the interface between the resist and the film containing chromium is deactivated. However, in the present embodiment, the film containing no chromium is formed directly between the film containing chromium and the chemical amplification resist, allowing the acid in the chemical amplification resist to be prevented from being deactivated. Thus, the appropriate cross-sectional shape of the resist can be obtained.

Furthermore, if the film containing chromium is not substantially etched by the dry etching using fluorine (F) and which can be etched by the dry etching using oxygen-containing chlorine (Cl/O), while the film containing no chromium is not substantially etched by the dry etching using oxygen-containing chlorine (Cl/O) and which can be etched by the dry etching using fluorine (F), the size of the film containing chromium deviates from that of the film containing no chromium. This is because when the film containing chromium and the film containing no chromium are etched, the dry etching using oxygen-containing chlorine (Cl/O), which is isotropic, needs to be combined with the dry etching using fluorine (F), which is anisotropic. However, the present embodiment is configured such that the composition and film thickness of the film containing no chromium are selected as needed and that the film containing no chromium is dry etched using oxygen-containing chlorine (Cl/O). This eliminates the need to combine the dry etching using oxygen-containing chlorine (Cl/O), which is isotropic, with the dry etching using fluorine (F), which is anisotropic. Thus, the deviation of the size between the film containing chromium and the film containing no chromium can be reduced, avoiding the deviation of size of the final photomask pattern and degradation of cross-sectional shape of the underlying film.

Furthermore, the film containing chromium and the film containing no chromium can be etched under the same etching conditions, that is, the dry etching using oxygen-containing chlorine. Thus, the film containing chromium and the film containing no chromium can be consecutively etched.

As a result, the cycle time of photomask production and the management load of the etching apparatus can be reduced, and the appropriate size and cross-sectional shape of the photomask pattern can be obtained. Thus, the use of such a method for manufacturing a photomask blank and a photomask provides a photomask with a fine mask pattern accurately formed therein and corresponding to the pattern transfer for the half-pitch 45 nm generation and beyond.

Moreover, the composition and film thickness of the film containing no chromium are selected as needed to also enable the dry etching using fluorine (F). Thus, when the film located under the film containing chromium is dry etched using fluorine (F), the film containing no chromium can be simultaneously removed, eliminating the need to add a special step for only removing the film containing no chromium; this will be described below in detail.

The chromium compound mainly comprises chromium oxide, chromium nitride, or chromium oxynitride, and the transmittance and reflectance of the film can be adjusted by varying the content of oxygen or nitrogen.

The present invention will be described below in detail by taking examples.

EXAMPLE 1

As show in FIG. 1, the phase-shift mask blank 15 comprises the phase-shift film 12 located on the transparent substrate 11 and which is not substantially etched by the dry etching using oxygen-containing chlorine and which can be etched by the dry etching using fluorine. The phase-shift mask blank 15 comprises the light blocking film 13 located on the phase-shift film 12 and containing chromium and which is not substantially etched by the dry etching using fluorine and which can be etched by the dry etching using oxygen-containing chlorine. The phase-shift photomask blank 15 comprises the film 14 located on the light blocking film 13 and containing no chromium and which can be etched by the dry etching using fluorine and the dry etching using oxygen-containing chlorine.

Here, the transparent substrate 11 is, for example, fused silica. The phase-shift film 12 is formed of a silicon compound mainly comprising, for example, silicon oxide and in which metal is contained. For the phase-shift film 12, the ratio of contents and the film thickness are selected as needed to adjust the transmittance and phase difference with respect to the exposure wavelength. The value of the transmittance with respect to the exposure wavelength is at least 2% and at most 40% when production of a photomask is finally completed. Furthermore, the value of the phase difference with respect to the exposure wavelength is at least 170 degrees and at most 190 degrees when production of a photomask is finally completed.

The light blocking film (first film) 13 containing chromium is a metal compound film mainly comprising, for example, chromium oxide. The film thickness of the light blocking film 13 is at least 30 nm and at most 120 nm and is selected such that for the light blocking film 13 and the underlying phase-shift film, the transmittance with respect to the exposure wavelength is at most 0.1%.

The film (second film) 14 containing no chromium contains molybdenum (transition metal). The film 14 containing no chromium is at least 1 nm and at most 5 nm in film thickness. The specific atomic configuration of the film 14 containing no chromium is such that for example, molybdenum accounts for 10 to 100 at % of the sum of the molybdenum and silicon. Furthermore, in terms of easiness of etching processing for the dry etching using oxygen-containing chlorine (Cl/O), molybdenum accounts for 30 to 100 at % of the sum of the molybdenum and silicon.

Now, a method for manufacturing a phase-shift mask using the phase-shift mask blank 15 will be described with reference to FIG. 3 to FIG. 10. FIG. 3 to FIG. 10 are cross-sectional views schematically showing the method for manufacturing a phase-shift mask using the phase-shift mask blank 15.

The method for manufacturing a phase-shift mask using the phase-shift mask blank 15 includes a step of consecutively pattering the light blocking film (second film) 13 containing chromium (first film) and the film 14 containing no chromium by means of the dry etching using oxygen-containing chlorine (Cl/O).

First, as shown in FIG. 3, a resist film 16 is formed on the film 14 of the phase-shift mask blank 15, which contains no chromium. The resist 16 is a chemical amplification resist. The resist film 16 is, for example, at least 50 nm and at most 350 nm in film thickness.

Then, as shown in FIG. 4, an electron beam lithography apparatus (not shown in the drawings) is used to draw a pattern on the resist film 16 formed on the film 14 containing no chromium. In this case, an electron beam has an energy density of 3 to 40 µC/cm². After the drawing, a heating treatment and a development treatment are carried out to form a pattern in the resist film 16.

Then, as shown in FIG. 5, the resist film 16 with the pattern formed therein is used as a mask to consecutively pattern the film (second film) 14 containing no chromium and the light blocking film (first film) 13 containing chromium by means of the dry etching using oxygen-containing chlorine (Cl/O). Furthermore, the phase-shift film 12 is not substantially etched by the dry etching using oxygen-containing chlorine (Cl/O) and thus remains unpatterned during the present step.

Figure 6:
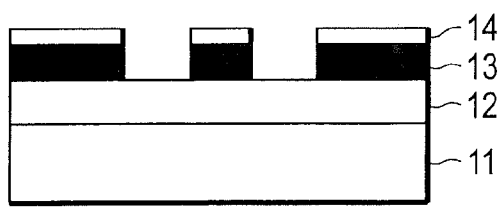
FIG. 6 is a cross-sectional view schematically showing a part of the method for manufacturing a photomask according to Example 1 of the present invention.

Then, as shown in FIG. 6, after the film 14 containing no chromium and the light blocking film 13 containing chromium are patterned by the dry etching using oxygen-containing chlorine, the remaining resist film 16 is stripped and removed. The resist film 16 can be stripped and removed by dry etching, but in the present example, is subjected to wet stripping using a release agent.

Figure 7:
FIG. 7 is a cross-sectional view schematically showing a part of the method for manufacturing a photomask according to Example 1 of the present invention.

Then, as sown in FIG. 7, the film 14 containing no chromium and light blocking film 13 containing chromium with the pattern formed therein are used as a mask to pattern the phase-shift film 12 by the dry etching using fluorine (F). Furthermore, the film (second film) 14 containing no chromium is removed can also be etched by the dry etching using fluorine (F) and is thus removed during the present step. The light blocking film (first film) 13 containing chromium is not substantially etched by the dry etching using fluorine (F) and thus remains unremoved during the preset step.

Figure 8:
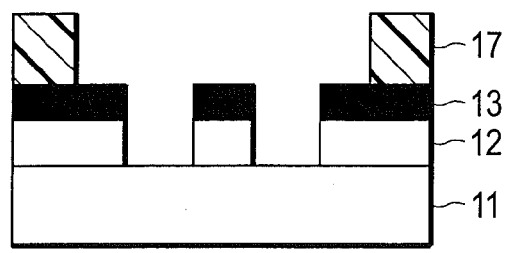
FIG. 8 is a cross-sectional view schematically showing a part of the method for manufacturing a photomask according to Example 1 of the present invention.

Then, as shown in FIG. 8, a resist film 17 is formed on the light blocking film 13 containing chromium and the transparent substrate 11. Then, as shown in FIG. 4, the electron beam lithography apparatus (not shown in the drawings) is used to draw a pattern. Thereafter, a heating treatment and a development treatment are carried out to form a pattern in the resist film 17.

Then, as shown in FIG. 9, the resist film 17 with the pattern formed therein is used as a mask to pattern the light blocking film 13 containing chromium by means of the dry etching using oxygen-containing chlorine (Cl/O). The phase-shift film 12 is not substantially etched by the dry etching using oxygen-containing chlorine (Cl/O) and thus remains unpatterned during the present step.

Then, as shown in FIG. 10, the remaining resist film 17 is stripped and removed. The resist film 17 can be stripped and removed by dry etching, but in the present example, is subjected to wet stripping using a release agent.

Through the above-described steps, the phase-shift mask according to Example 1 of the present invention is completed.

EXAMPLE 2

As shown in FIG. 2, the photomask blank (binary mask blank) 25 according to the embodiment of the present invention comprises the light blocking film 22 located on the transparent substrate 21 and which is not substantially etched by the dry etching using oxygen-containing chlorine (Cl/O) and which can be etched by the dry etching using fluorine (F). The photomask blank 25 comprises the hard mask film (first film) 23 located on the light blocking film 22 and containing chromium and which is not substantially etched by the dry etching using fluorine (F) and which can be etched by the dry etching using oxygen-containing chlorine (Cl/O). The photomask blank 25 comprises the film (second film) 24 located on the hard mask film 23 and containing no chromium and which can be etched by the dry etching using fluorine (F) and the dry etching using oxygen-containing chlorine (Cl/O).

Here, the composition and film thickness of the transparent substrate 21 are similar to those of the above-described transparent substrate 11. The light blocking film 22 is, for example, silicon oxide in which metal is contained. For the light blocking film 22, the ratio of contents and the film thickness are selected as needed to adjust the transmittance with respect to the exposure wavelength. The value of the transmittance with respect to the exposure wavelength is at most 0.1% when production of a photomask is finally completed.

The hard mask (first film) 23 containing chromium is a metal compound film mainly comprising, for example, chromium oxide and is at least 2 nm and at most 5 nm in film thickness.

The ranges of specific configuration and thickness of the film (second film) 24 containing no chromium is similar to those of the above-described film 14 containing no chromium.

Now, a method for manufacturing a binary mask using the binary mask blank 25 will be described with reference to FIG. 11 to FIG. 16. FIG. 11 to FIG. 16 are cross-sectional views schematically showing the method for manufacturing a binary mask using the binary mask blank 25.

The method for manufacturing a binary mask using the binary mask blank 25 includes a step of consecutively pattering the hard film (first film) 23 containing chromium and the film (second film) 24 containing no chromium by means of the dry etching using oxygen-containing chlorine (Cl/O).

First, as shown in FIG. 11, a resist film 26 is formed on the film 24 of the binary mask blank 25, which contains no chromium. The material and film thickness of the resist are similar to those of the above-described resist film 16, shown in FIG. 3. Then, as shown in FIG. 12, the electron beam lithography apparatus (not shown in the drawings) is used to draw a pattern on the resist film 26 formed on the film 24 containing no chromium. After the drawing, a heating treatment and a development treatment are carried out to form a pattern in the resist film 26. Drawing conditions and development conditions in this case are similar to those shown in FIG. 4, described above.

Then, as shown in FIG. 13, the resist film 26 with the pattern formed therein is used as a mask to consecutively pattern the film 24 containing no chromium and the hard mask film containing chromium 23 by means of the dry etching using oxygen-containing chlorine (Cl/O). Furthermore, the light blocking film 22 is not substantially etched by the dry etching using oxygen-containing chlorine (Cl/O) and thus remains unpatterned during the present step.

Then, as shown in FIG. 14, after the film 24 containing no chromium and the light blocking film containing chromium 23 are patterned by the dry etching using oxygen-containing chlorine, the remaining resist film 26 is stripped and removed. Conditions for stripping and removal of the resist film 26 are similar to those shown in FIG. 6, described above.

Then, as shown in FIG. 15, the film 24 containing no chromium and hard mask 23 containing chromium with the pattern formed therein are used as a mask to pattern the light blocking film 22 by the dry etching using fluorine (F). Furthermore, the film 24 containing no chromium is removed can also be etched by the dry etching using fluorine (F) and is thus removed during the present step. The hard mask 23 containing chromium is not substantially etched by the dry etching using fluorine (F) and thus remains unremoved during the preset step.

Then, as shown in FIG. 16, the hard mask 23 containing chromium is removed by the dry etching using oxygen-containing chlorine (Cl/O), and the remaining structure is cleaned. The light blocking film 22 is not substantially etched by the dry etching using oxygen-containing chlorine (Cl/O) and thus remains unremoved during the preset step.

Through the above-described steps, the binary mask according to Example 2 of the present invention is completed.

The embodiment and examples of the present invention have been described. However, the present invention is not limited to the above-described embodiment and examples and can be varied for implementation without departing from the scope of the present invention. Moreover, the above-described embodiment includes various levels of inventions, and various inventions can be extracted by combining the disclosed constituent requirements together as needed. For example, even if some of the disclosed constituent requirements are removed, an invention can be extracted provided that a predetermined effect is exerted.

The present invention selects the appropriate ranges of the layer structure, composition, and film thickness of the photomask blank and the steps and conditions for manufacture of a photomask. The present invention can thus provide a photomask with a fine photomask pattern formed therein and corresponding to the pattern transfer for the half pitch 45 nm generation and beyond.

EXPLANATION OF REFERENCE SYMBOLS

11 . . . Transparent substrate
12 . . . Phase-shift film
13 . . . Light blocking film
14 . . . Film
15 . . . Photomask blank
16 . . . Resist film
17 . . . Resist film
21 . . . Transparent substrate
22 . . . Light blocking film
23 . . . Hard mask film
24 . . . Film
25 . . . Photomask blank
26 . . . Resist film

What is claimed is:

1. A photomask blank comprising:
    a first film containing chromium and which is not substantially etched by dry etching using fluorine and which is etchable by dry etching using oxygen-containing chlorine, the first film being a metal compound film mainly comprising chromium oxide, chromium nitride, or chromium oxynitride, or a metal film or an alloy film mainly comprising chromium;
    a second film, stacked on the first film, containing no chromium and which is etchable by dry etching using fluorine and is etchable by dry etching using oxygen-containing chlorine, the second film being a silicon oxide film, a silicon nitride film, or a silicon oxynitride film, and the second film containing a transition metal selected from molybdenum, tantalum, tungsten, zirconium, hafnium, vanadium, and niobium, wherein an atomic configuration of the second film is such that the transition metal accounts for at least 10 at % of a sum of the transition metal and silicon;
    at least one of a light blocking film, an antireflective film, a hard mask film, a phase-shift film, and a transparent substrate, each of which is not substantially etched by the dry etching using oxygen-containing chlorine and each of which is etchable by the dry etching using fluorine, provided under the first film; and
    a chemical amplification resist film for electron beam lithography, which is at least 50 nm and at most 350 nm in film thickness, formed on and in contact with the second film.

2. The photomask blank according to claim 1, wherein the first film is at least one of
    a light blocking film having a first film thickness of 30 nm to 120 nm,
    an antireflective film having a first film thickness of 30 nm to 120 nm, and
    a hard mask film having a second film thickness of 2 nm to 30 nm.

3. The photomask blank according to claim 1, wherein the second film is at least 0.5 nm and at most 10 nm in film thickness.

4. A method for manufacturing a photomask, comprising:
    providing a photomask blank that comprises:
        a first film containing chromium and which is not substantially etched by dry etching using fluorine and which is etchable by dry etching using oxygen-containing chlorine, the first film being a metal compound film mainly comprising chromium oxide, chromium nitride, or chromium oxynitride, or a metal film or an alloy film mainly comprising chromium, and
        a second film, stacked on the first film, containing no chromium and which is etchable by dry etching using fluorine and etchable by dry etching using oxygen-containing chlorine, the second film being a silicon oxide film, a silicon nitride film, or a silicon oxynitride film, and the second film containing a transition metal selected from molybdenum, tantalum, tungsten, zirconium, hafnium, vanadium, and niobium, wherein an atomic configuration of the second film is such that the transition metal accounts for at least 10 at % of a sum of the transition metal and silicon;

forming a resist pattern on the second film; and using the resist pattern as an etching mask to etch the first film and the second film by the dry etching using oxygen-containing chlorine, wherein at least one of a light blocking film, an antireflective film, a hard mask film, a phase-shift film, and a transparent substrate, each of which is not substantially etched by the dry etching using oxygen-containing chlorine and each of which is etchable by the dry etching using fluorine, is provided under the first film, and a chemical amplification resist film for electron beam lithography, which is at least 50 nm and at most 350 nm in film thickness, is formed on and in contact with the second film.

5. The method for manufacturing a photomask according to claim 4, wherein the first film is at least one of a light blocking film having a first film thickness of 30 nm to 120 nm, an antireflective film having a first film thickness of 30 nm to 120 nm, and a hard mask film having a second film thickness of 2 nm to 30 nm.

6. The method for manufacturing a photomask according to claim 4, wherein the second film is at least 0.5 nm and at most 10 nm in film thickness.

* * * * *